US00RE37778E

(19) United States
(12) Reissued Patent
Feldtkeller

(10) Patent Number: US RE37,778 E
(45) Date of Reissued Patent: Jul. 2, 2002

(54) CURRENT LIMITING CIRCUIT

(75) Inventor: Martin Feldtkeller, Müchen (DE)

(73) Assignee: Siemens Aktiengesellschaft, Munich (DE)

(21) Appl. No.: 09/845,864

(22) Filed: Apr. 30, 2001

Related U.S. Patent Documents

Reissue of:
(64) Patent No.: 6,054,845
Issued: Apr. 25, 2000
Appl. No.: 09/383,870
Filed: Aug. 26, 1999

U.S. Applications:

(63) Continuation of application No. PCT/DE98/00262, filed on Jan. 29, 1998.

(30) Foreign Application Priority Data

Feb. 26, 1997 (DE) ..... 197 07 708

(51) Int. Cl.[7] ..... G05F 1/573; G05F 3/26
(52) U.S. Cl. ..... 323/277; 323/315
(58) Field of Search ..... 323/312, 315, 323/273, 275, 276, 277; 327/309, 538

(56) References Cited

U.S. PATENT DOCUMENTS 4,831,323 A * 5/1989 Melbert ..... 323/311
4,868,429 A * 9/1989 Wolber et al. ..... 307/540
5,363,063 A * 11/1994 Laot et al. ..... 330/298
5,384,549 A * 1/1995 Araki ..... 330/298
5,422,593 A * 6/1995 Fujihira ..... 327/561
5,519,341 A * 5/1996 Corsi et al. ..... 327/80
5,550,462 A * 8/1996 Nakajima ..... 323/277
5,570,060 A * 10/1996 Edwards ..... 327/541
5,619,115 A * 4/1997 Kajita ..... 320/1
6,002,288 A * 12/1999 Corsi ..... 327/309

FOREIGN PATENT DOCUMENTS

DE 4429716 C1 * 2/1996

OTHER PUBLICATIONS

"Smart Power Ics: Technology and Application", B. Murari et al., Spring Verlag, Berlin–Heidelberg, NY, 1996, pp. 328, 400, 426.*

* cited by examiner

*Primary Examiner*—Adolf Deneke Berhane
(74) *Attorney, Agent, or Firm*—Laurence A. Greenberg; Werner H. Stemer; Ralph E. Locher

(57) ABSTRACT

The present invention relates to a current limiting circuit for controlled semiconductor power components, in particular to a current limiting circuit for power transistors which is independent of its voltage supply. A current limiting circuit for controlled semiconductor power components, in particular for power transistors, with a sense resistor, which is connected in series with the main current path of the controlled semiconductor power component, generating a voltage drop proportional to the current through the controlled semiconductor power component. A current mirror circuit device has a first current source device for generating a first current between a first and a second reference-ground potential. A second current source device generates a second current between the control potential of the control terminal of the semiconductor power component and a third reference-ground potential. A current source coupling circuit couples the first and second current source devices in response to the voltage drop of the sense resistor. When the voltage drop is greater than a predetermined value, the second current, for the purpose of lowering the control potential, is increased in order to limit the current through the semiconductor power component.

13 Claims, 5 Drawing Sheets

CURRENT LIMITING CIRCUIT

Matter enclosed in heavy brackets [ ] appears in the original patent but forms no part of this reissue specification; matter printed in italics indicates the additions made by reissue.

CROSS-REFERENCE TO RELATED APPLICATION

This is a continuation of copending International Application PCT/DE98/00262, filed Jan. 29, 1998, which designated the United States.

BACKGROUND OF THE INVENTION

1. Field of the Invention

The present invention relates to a current limiting circuit for controlled semiconductor power components, in particular to a current limiting circuit for power transistors.

Integrated power circuits require effective protection against current overloading at their outputs, in order to prevent thermal destruction in the event of a possible short circuit.

While the invention is applicable in principle to all controlled semiconductor power components, the present invention and the problem area on which it is based are explained with reference to power ICs using hybrid technology which provide not only MOS power transistors but also bipolar components and CMOS components.

The customary basic principle for such a current limiting circuit consists in the total current flowing through the power transistor or, using the sense cell principle, part of this total current generating a voltage drop across a resistor (also referred to as shunt resistor).

If the voltage drop exceeds a predetermined maximum value, the current limiting circuit loads the drive signal of the power transistor to such a great extent that the output current of the power transistor, which can be determined from the drive signal by way of the family of output characteristic curves, remains below a permissible limit value.

There exist a variety of approaches in the prior art for implementing that basic principle in circuitry terms.

In general, a distinction is made between current-regulation limiting circuits and voltage-regulation limiting circuits.

Current-regulation limiting circuits generally require a filter for masking inrush spikes. Voltage-regulation limiting circuits require temperature compensation circuits. Furthermore, the prior art circuits of both circuit types again themselves require complex protective circuitry for the occurrence of a short circuit.

Examples of that prior art are found in "Smart Power ICs: Technologies and Applications," Murari, Bertotti, and Vignola (Eds.), pp. 328, 400, 426, Springer Verlag, Berlin-Heidelberg-New York, 1996.

U.S. Pat. No. 5,519,341 to Corsi et al. discribes a current limiting circuit for a power transistor with a current sense resistor and a comparator comprising four bipolar transistors and two current sources. The current threshold at which the comparator responds can be set by way of the emitter areas of the cross-connected bipolar transistors.

A further current limiter circuit is disclosed in German patent DE 44 29 716. There, a current mirror circuit is connected to the current sense resistor.

SUMMARY OF THE INVENTION

It is accordingly an object of the invention to provide a current limiting circuit, which overcomes the above-mentioned disadvantages of the heretofore-known devices of this general type and which can be realized in a simple manner, functions largely independently of its voltage supply and has a high accuracy.

With the foregoing and other objects in view there is provided, in accordance with the invention, a current limiting circuit for a controlled semiconductor power component having a main current path, a source terminal, and a control terminal, the circuit which comprises:

a sense resistor connected in series with a main current path of a controlled semiconductor power component, the sense resistor having a terminal connected to a source terminal of the semiconductor power component;

a first supply voltage terminal and a second supply voltage terminal;

a first bipolar transistor having a collector, an emitter, a base, and load path, a second bipolar transistor having a collector, a base, and a load path, and a current source connected in series with the load paths between the first supply voltage terminal and the terminal of the sense resistor connected to the source terminal of the semiconductor power component, the first bipolar transistor and the second bipolar transistors being connected such that respective collector currents thereof are proportional to one another;

a third bipolar transistor having an emitter and a load path, and a fourth bipolar transistor having a base, a collector, and a load path connected in series with the load path of the third bipolar transistor between the control terminal and the second supply voltage terminal, the emitter of the third bipolar transistor receiving a current impressed on the emitter proportional to a collector current of the fourth bipolar transistor;

the collector and the base of the first bipolar transistor being connected to the base of the third bipolar transistor;

the base of the second bipolar transistor being coupled to a node between the emitter of the third bipolar transistor and the collector of the fourth bipolar transistor;

the base of the fourth bipolar transistor being coupled to a node between the emitter of the first bipolar transistor and the collector of the second bipolar transistor;

whereby an emitter-to-base voltage of the fourth bipolar transistor contains, as voltage components, a voltage drop across the sense resistor, an emitter-to-base voltage of the second and third bipolar transistors with positive sign, and an emitter-to-base voltage of the first bipolar transistor with negative sign, and further voltage components resulting from differences between emitter-to-base voltages of further bipolar transistors operated with a different emitter current density; and wherein the bipolar transistors are of the same type.

With the above and other objects in view there is also provided, in accordance with the invention, a current limiting circuit for a controlled semiconductor power component driven with a drive potential and having a main current path, comprising:

a current sense resistor connected in series with a main current path of a controlled semiconductor power component;

a load output terminal;

a first current mirror including a first PNP bipolar transistor having a collector and having an emitter connected to a drive potential of a semiconductor power component, and a second PNP bipolar transistor having an emitter connected to the drive potential of the semiconductor power component;

a second current mirror including a third PNP bipolar transistor having an emitter connected to the drive potential of the semiconductor power component, and a fourth PNP bipolar transistor having an emitter connected to the drive potential of the semiconductor power component;

a third current mirror including a first MOS transistor having a source connected to reference ground potential, and a second MOS transistor having a drain and a source connected to the reference-ground potential;

a fourth current mirror including a third MOS transistor having a drain and having a source connected to the reference ground potential and a fourth MOS transistor having a collector and a source connected to the reference ground potential;

a first NPN bipolar transistor having a base, a collector, and an emitter connected to the drain of the third MOS transistor;

a second NPN bipolar transistor connected between the collector of the fourth PNP bipolar transistor and a terminal of the sense resistor connected to the semiconductor power component, the second NPN bipolar transistor having a base;

a third NPN bipolar transistor having a base connected to the base of the first NPN bipolar transistor, a collector, and an emitter connected to the drain of the second MOS transistor and to the base of the second NPN bipolar transistor;

a fourth NPN bipolar transistor connected between the collector of the first PNP bipolar transistor and the terminal of the sense resistor connected to the load output terminal, the fourth NPN bipolar transistor having a base connected to of the emitter of the first NPN bipolar transistor;

a diode connecting the collectors of the first and the third NPN bipolar transistors to the drive potential of the semiconductor power component in the forward direction;

a fifth MOS transistor and a sixth MOS transistor connected in series between the reference-ground potential of the fourth current mirror and a terminal of the semiconductor power component connected to a supply potential;

the fifth MOS transistor having a gate connected to the collector of the third PNP bipolar transistor and the sixth MOS transistor having a gate connected to the drive potential of the semiconductor power component; and the base of the first NPN bipolar transistor and the base of the third NPN bipolar transistor being commonly connected to a node between the fifth MOS transistor and the sixth MOS transistors.

In other words, the objects of the invention are satisfied by way of a current limiting circuit for controlled semiconductor power components, in particular for power transistors, with a sense resistor which is connected in series with the main current path of the controlled semiconductor power component, for the purpose of generating a voltage drop reproducing the current through the controlled semiconductor power component.

The second embodiment is particularly suitable for high-side switches.

In accordance with an added feature of the invention, at least one of the four bipolar transistors has an emitter area which differs from that of the other bipolar transistors.

In accordance with an additional feature of the invention, the current limiting circuit has the following further features:

a fifth and a sixth bipolar transistor, which are connected, in each case in series with an associated current source, between the first and second reference-ground potentials;

where the base of the second bipolar transistor is connected to a node located between the emitter of the fifth bipolar transistor and the corresponding current source, and the base of the fifth bipolar transistor is connected to a node located between the emitter of the third and the collector of the fourth bipolar transistor; and where the base of the fourth bipolar transistor is connected to a node located between the emitter of the sixth bipolar transistor and the corresponding current source, and the base of the sixth bipolar transistor is connected to a node located between the emitter of the first and the collector of the second bipolar transistor.

The sensitivity of the current limiting circuit according to the invention is increased in this embodiment.

In accordance with another feature of the invention, the current sources of the fifth and sixth bipolar transistors are a resistor in each case.

In accordance with a further feature of the invention, the current sources of the fifth and sixth bipolar transistors are an NMOS transistor in each case.

In accordance with a concomitant feature of the invention, the common gate potential of the NMOS transistors is the potential of the common base terminal of the first and third bipolar transistors.

Other features which are considered as characteristic for the invention are set forth in the appended claims.

Although the invention is illustrated and described herein as embodied in a current limiting circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Identical reference symbols designate identical or functionally identical component parts throughout the figures.

Figure 5:
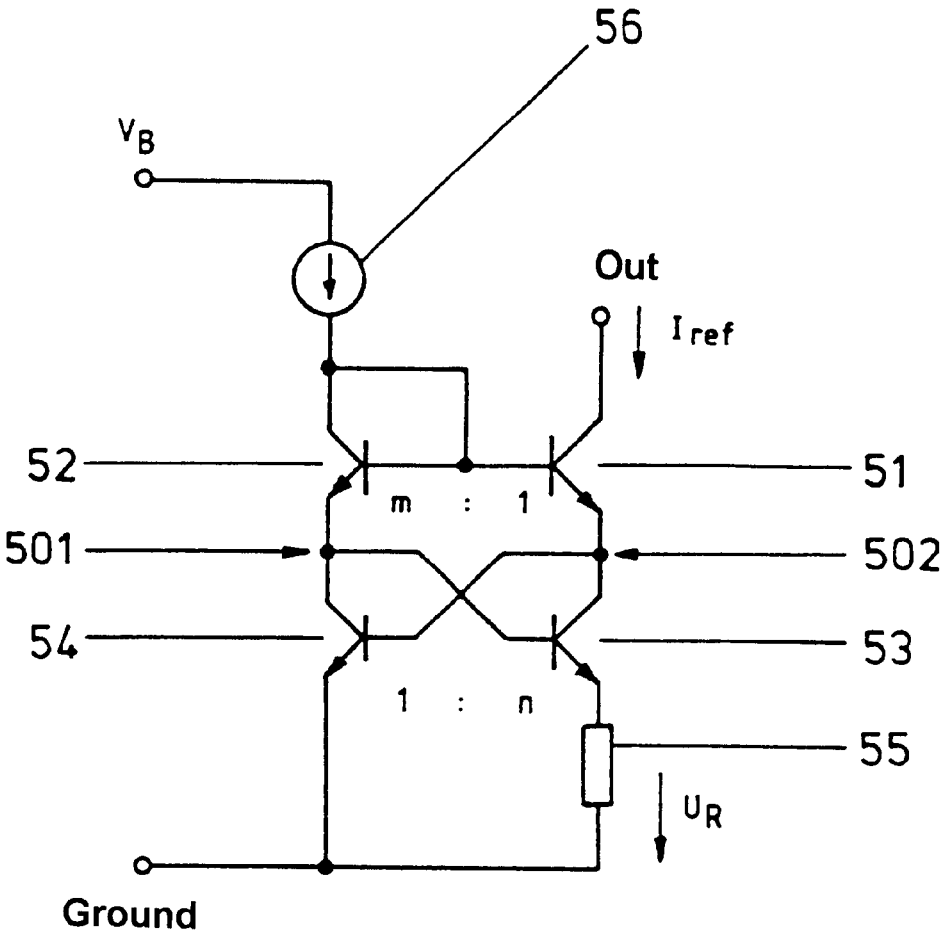
FIG. 5 is a circuit schematic of a conventional reference current source circuit that forms the starting point for the present invention.

Referring now to the figures of the drawing in detail and first, particularly, to FIG. 5 thereof, there is seen a conventional reference current source circuit which forms the basis for the current limiting circuit of the invention.

In FIG. 5, the reference symbols 51, 52, 53 and 54 designate NPN bipolar transistors. The transistors 52 and 54, and also 51 and 53, are connected in series and define a first and a second main current path 501 and 502, respectively.

The first main current path 501 is connected between a positive battery potential $V_B$ and a negative battery potential (ground). A constant-current source 56 is connected into the current path 501.

The emitter areas of the transistors 52 and 51 are in the ratio m:1, and the emitter areas of the transistors 54 and 53 are in the ratio 1:n. If all the base currents are disregarded, then the collector currents of the transistors 54 and 52 are identical, as are the collector currents of the transistors 53 and 51.

The cross-coupling of the transistors 54 and 53 produces, together with the exponential dependence of the collector current on the emitter-base voltage, said dependence being typical for bipolar transistors, a difference between the emitter potentials of the transistors 53 and 54 of $$U_R = \ln(m \cdot n) \cdot kT/e$$

independently of the ratio of the currents in the paths 501 and 502.

The difference between the emitter potentials UR is simultaneously the voltage drop $U_R$ across the resistor 55, which is likewise located in the current path 502. The resistance of the resistor 55 consequently determines the current $I_{ref}$ that can be picked off at the output OUT, independently of the current of the current source 56.

Figure 1:
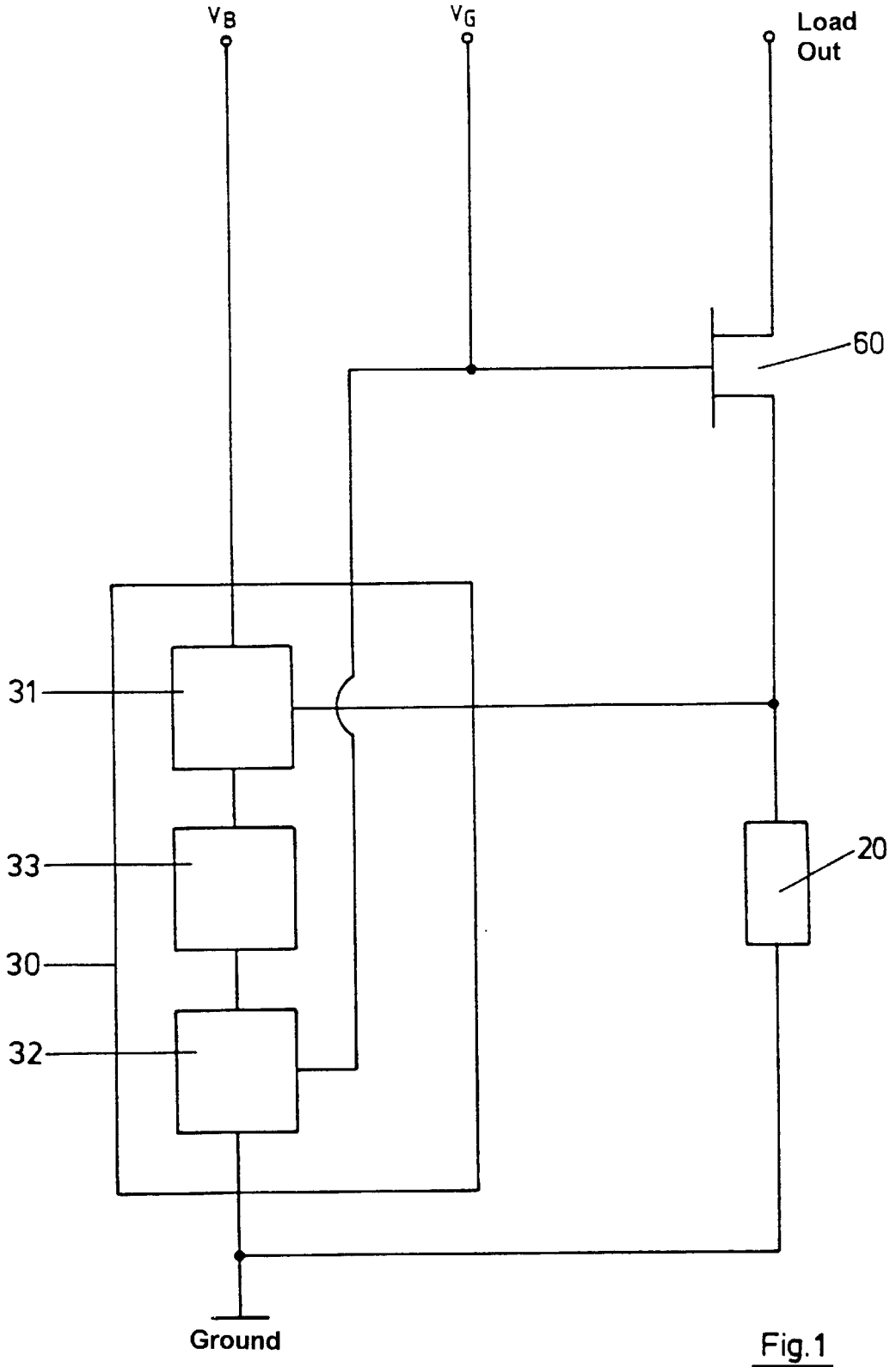
FIG. 1 is a block diagram of a current limiting circuit ording to the invention.

Referring now to FIG. 1, there is shown a basic illustration of the current limiting circuit according to the invention.

The current limiting circuit for controlled semiconductor power components illustrated in FIG. 1 is provided for a MOS power transistor 60.

The reference symbol 20 designates a sense resistor, which is connected in series with a main current path of the MOS power transistor 60. The resistor 20 is inserted for the purpose of generating a voltage drop reproducing the current through the MOS power transistor 60.

A current mirror circuit device 30 comprises a first current source device 31 for generating a first current between a first and a second reference-ground potential, in this case the positive battery voltage VB and the negative battery voltage (ground), and through the sense resistor 20.

Furthermore, the current mirror circuit device 30 comprises a second current source device 32 for generating a second current between the control potential $V_G$ of the control terminal of the MOS power transistor 60 and a third reference-ground potential (in this case ground).

Finally, the current mirror circuit device 30 is provided with a current source coupling circuit 33 for coupling the first and second current source devices 31, 32 in response to the voltage drop of the sense resistor. The coupling circuit functions in such a way that if the voltage drop is greater than a predetermined value, the second current, for the purpose of lowering the control potential, is increased in order to limit the current through the semiconductor power component.

Figure 2:
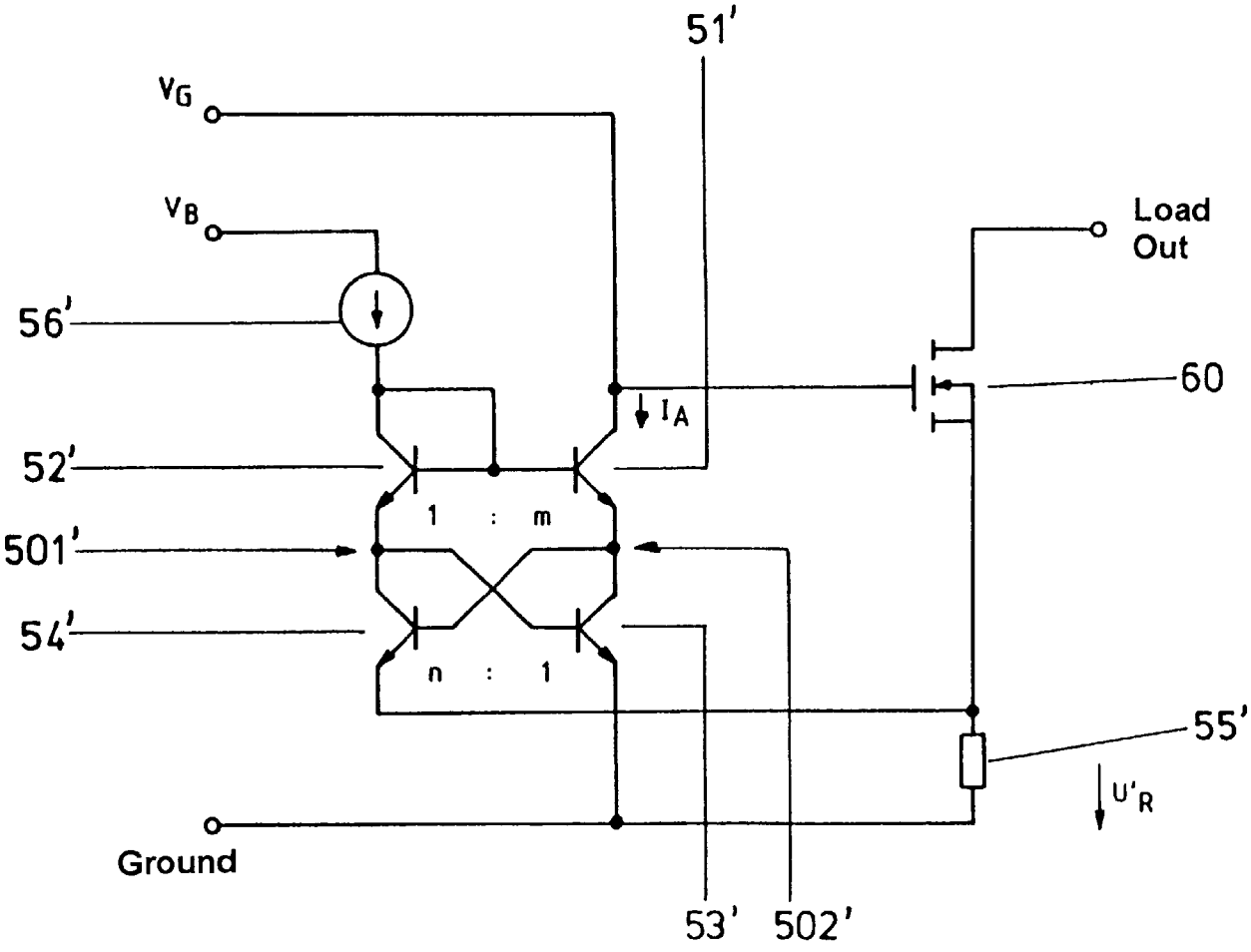
FIG. 2 is a circuit schematic of a first preferred embodiment the current limiting circuit according to the invention.

FIG. 2 shows a circuit diagram of a first preferred embodiment of the current limiting circuit according to the invention.

The reference symbols 51', 52', 53' and 54' designate NPN bipolar transistors, the transistors 52' and 54' and also 51' and 53' in each case being connected in series and defining a first and a second main current path 501' and 502', respectively.

The first main current path 501' is connected between the positive battery potential $V_B$ and the negative battery potential (ground) and contains a constant-current source 56' and also a resistor 55'.

The second main current path 502' is connected between the control terminal (gate) of a MOS power transistor 60 and the negative battery potential (ground). The main current path loads the drive signal source with a current $I_A$ The drive signal source supplies the drive potential $V_G$.

The emitter areas of the transistors 52' and 51' are in the ratio 1:m, and the emitter areas of the transistors 54' and 53' are in the ratio n:1.

If the mesh equations applicable to this circuit are used in a manner analogous to that in the case of the already described current source circuit according to FIG. 5, then $$U_R' = \ln(m \cdot n) \cdot kT/e$$

results for the difference between the emitter potentials of the transistors 54' and 53', independently of the ratio of the currents in the paths 501' and 502'.

The difference between the emitter voltages is impressed as a voltage drop $U_R'$ across the sense resistor 55'.

If the voltage drop across $U_R'$ is not equal to $\ln(m \cdot n) \cdot kT/e$, then the currents in the paths 501' and 502' can differ from one another until the base currents are no longer negligible.

If $U_R'$ is less than $\ln(m \cdot n) \cdot kT/e$, then the current in the path 502' assumes a value which is one to two orders of magnitude smaller than the predetermined current in the path 501'.

If the voltage $U_R'$ rises above $\ln(m \cdot n) \cdot kT/e$, then the current in the path 502' rises by a number of decades within a voltage change of a few millivolts.

This property is utilized by the invention in order to realize accurate, delay-free current limiting in that the current of the path 502' is used to reduce the drive potential of the semiconductor power switch.

The resistor 55' connected between the transistor 54' and ground is furthermore connected in series with the main current path of the controlled MOS power transistor 60 and generates a voltage drop reproducing the current flowing through the transistor.

The first embodiment illustrated in FIG. 2 differs from the reference current source circuit shown in FIG. 5 by virtue of the fact that instead of the resistor 55 in accordance with FIG. 5, the resistor 55' is provided as shunt resistor through which the load current flows. Owing to its resistance which is orders of magnitude smaller, it acts like a voltage source which is independent of the load current. Moreover, the emitter ratios are interchanged relative to those of FIG. 5.

On account of the internal coupling of the two current paths 501' and 502', the output current $I_A$ flowing in the second current path 502' is significantly less than the input current flowing in the first current path 501', if the voltage drop $U_R'$ across the resistor 55' is less than $\ln(m \cdot n) \cdot kT/e$.

On the other hand, the output current $I_A$ flowing in the second current path 502' is significantly greater than the input current flowing in the first current path 501', if the voltage drop across the resistor 55' is greater than $\ln(m \cdot n) \cdot kT/e$.

In the region of the voltage drop with the value ln(m·n)·kT/e, the output current rises by a number of decades within a change in the voltage drop of a few millivolts.

Thus, the desired current limiting can be achieved by choosing the input current correctly in terms of order of magnitude and tapping the output current $I_A$ from the control terminal of the MOS power transistor 60.

Figure 3:
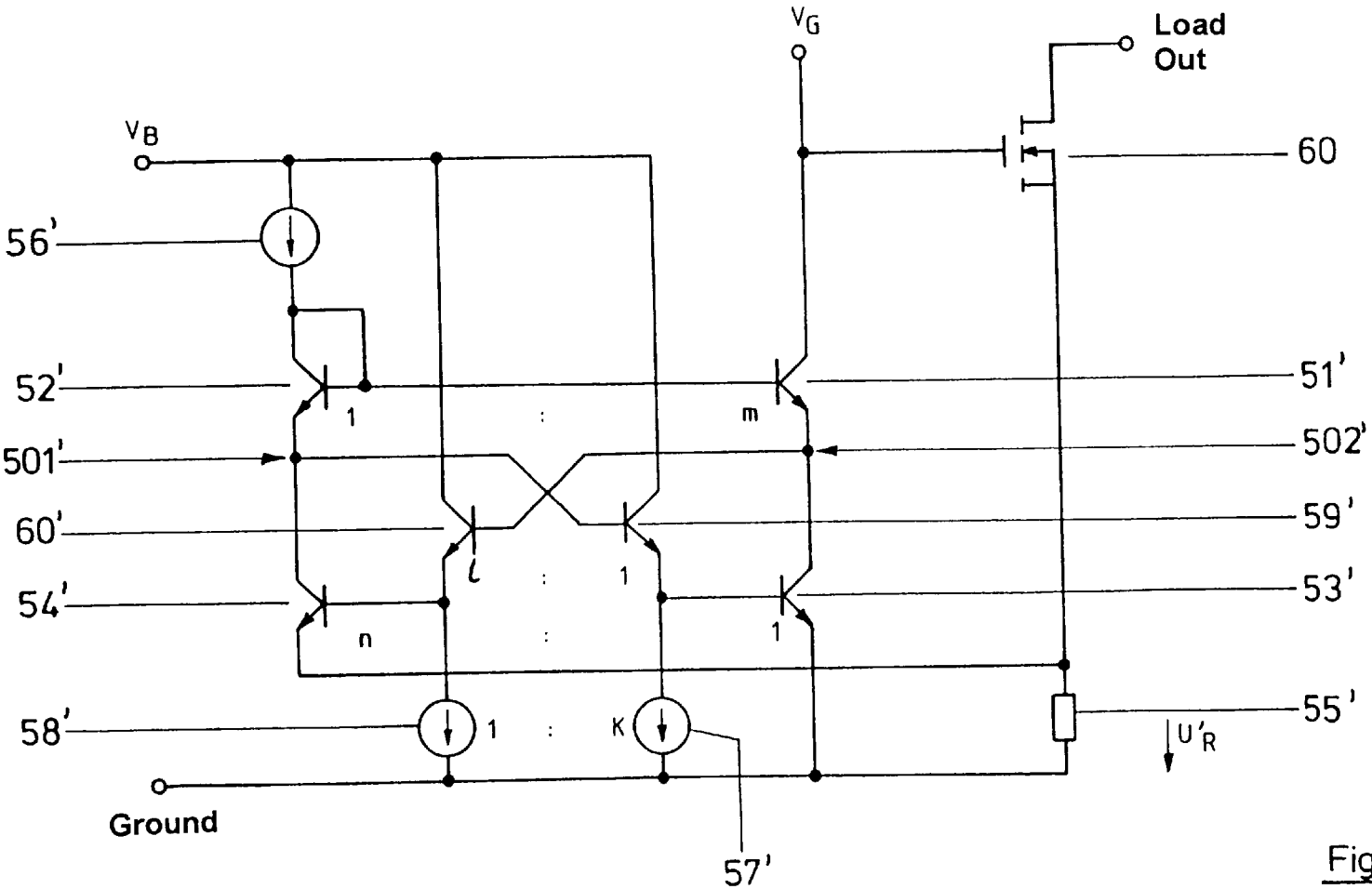
FIG. 3 is a circuit schematic of a second preferred embodiment the current limiting circuit according to the invention.

FIG. 3 shows a circuit diagram of a second preferred embodiment of the current limiting circuit according to the invention.

The second preferred embodiment is an extension of the first embodiment shown in FIG. 2 and additionally contains the NPN bipolar transistors 59' and 60' and also the current sources 57' and 58'.

These additional components serve for modified coupling of the first and second current paths 501' and 502' respectively.

In particular, in the second embodiment, unlike in the first embodiment, the base of the second transistor 54' is not connected to the node located between the emitter of the third transistor 51' and the collector of the fourth transistor 53', rather a further current translation stage, comprising the transistor 60' and the current source 58', is located in between.

In an analogous manner, in the second embodiment, unlike in the first embodiment, the base of the fourth transistor 54' is not connected to the node located between the emitter of the first transistor 52' and the collector of the second transistor 54', rather another further current translation stage, comprising the transistor 59' and the current source 57', is located in between.

The emitter area ratio between the current translation stage comprising the transistor 60' and the current source 58' and the current translation stage comprising the transistor 59' and the current source 57' is 1:1, the ratio of the currents generated by the current sources 58' and 57' being 1:k.

The circuit in accordance with the second preferred embodiment of the present invention as shown in FIG. 3 enables an even steeper rise of the output current IA in the region of the voltage drop with the value ln(m·n)·kT/e, because the two current translation stages introduce a third and fourth factor into the logarithm, which enables a greater voltage drop $U_R'$ across the resistor 55'.

The relative accuracy of the circuit can be continuously increased, therefore, by means of further current translation stages.

The current sources 58' and 57' with the emitter ratio 1:k may be designed as resistors in the simplest case, but preferably as NMOS transistors. The common base terminal of the transistors 52' and 51' is appropriate as the common gate potential of these NMOS transistors.

Figure 4:
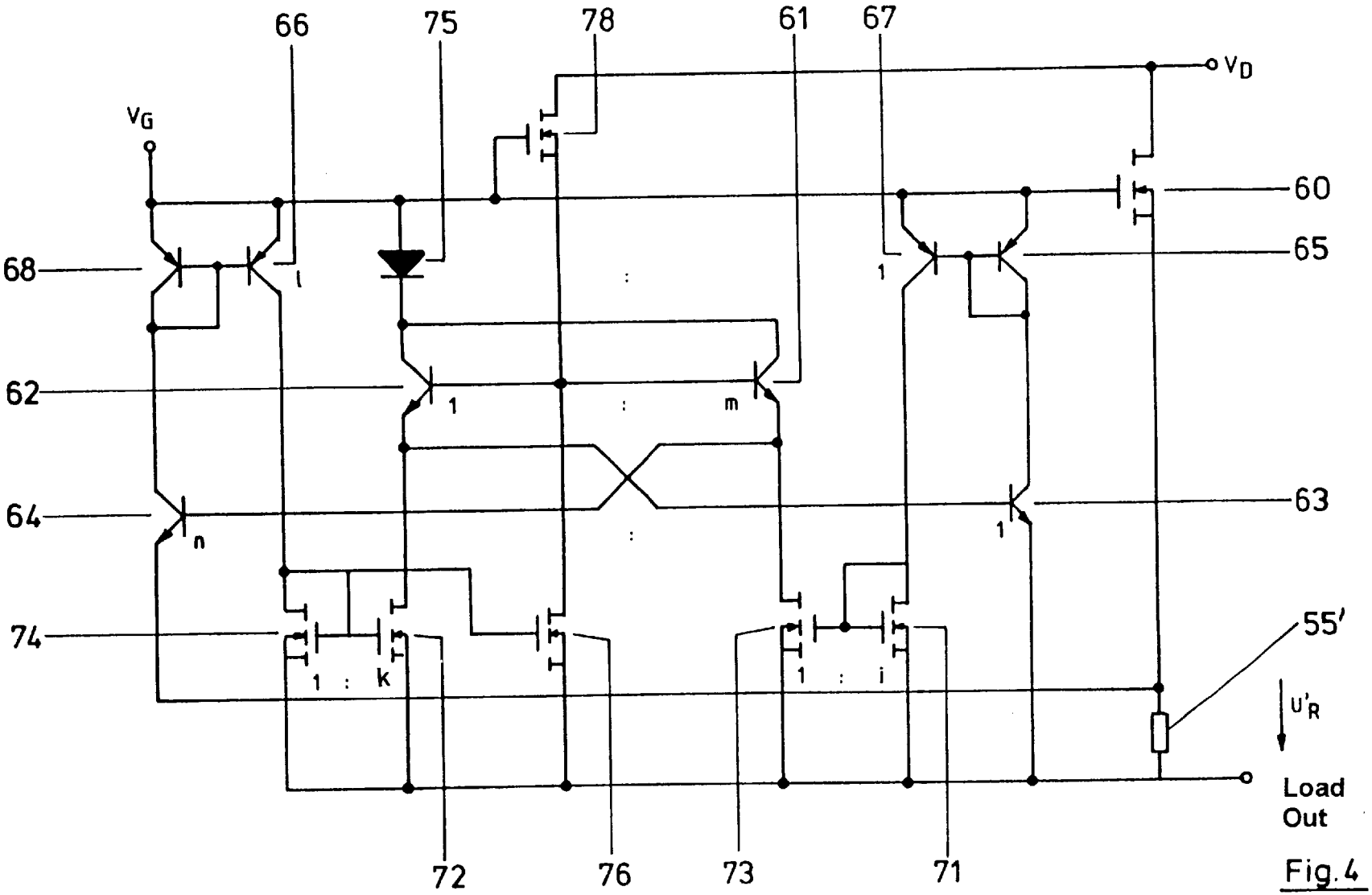
FIG. 4 is a circuit schematic of a third preferred embodiment of the current limiting circuit according to the invention.

FIG. 4 shows a circuit diagram of a third preferred embodiment of the current limiting circuit according to the invention.

Whereas the first and second embodiments described above are preferably used for a low-side switch, the third embodiment explained below relates specifically to a high-side switch.

In such high-side switches, a potential supply is not available referring to the drive signal of the MOS power transistor 60 and the source terminal of the MOS power transistor 60, said source terminal being connected to the load. In the case of these switches, it must thus be expected that when inductive loads are switched off, both the drive potential and the source potential become more negative than the substrate potential, with the result that no collectors of NPN transistors and no bases of lateral PNP transistors are allowed to be connected to the source or to the gate of the MOS power transistor 60.

The third embodiment of the present invention as shown in FIG. 4 fulfills these preconditions.

In FIG. 4, the reference symbols 61, 62, 63 and 64 designate NPN bipolar transistors and the reference symbols 65, 66, 67 and 68 designate PNP bipolar transistors.

Furthermore, the reference symbols 71, 72, 73 and 74 and also 76 and 78 designate MOS transistors.

The reference symbol 75 denotes a diode, VD designates the drain supply potential and VG the gate drive potential of the MOS power transistor 60.

A first current mirror comprises the first and second PNP bipolar transistors 65, 67, the emitter of which is in each case connected to the drive potential of the semiconductor power component 60.

A second current mirror comprises the third and fourth PNP bipolar transistors 66, 68, the emitter of which is in each case connected to the drive potential of the semiconductor power component 60.

A third current mirror comprises the first and second MOS transistors 71, 73, the source of which is in each case connected to a reference-ground potential, expediently to that terminal of the sense resistor 55' which is connected to the load output terminal.

A fourth current mirror comprises the third and fourth MOS transistors 72, 74, the source of which is in each case connected to a reference-ground potential, expediently to that terminal of the sense resistor 55' which is connected to the load output terminal.

The emitter of the first NPN bipolar transistor 62 is connected to the drain of the third MOS transistor 72.

The second NPN bipolar transistor 64 is connected between the collector of the fourth PNP bipolar transistor 68 and that terminal of the sense resistor 55' which is connected to the semiconductor power component 60.

The emitter of the third NPN bipolar transistor 61 is connected to the drain of the second MOS transistor 73.

The fourth NPN bipolar transistor 63 is connected between the collector of the first PNP bipolar transistor 65 and that terminal of the sense resistor 55' which is connected to the load output terminal.

The base terminals of the first and third NPN bipolar transistors 62, 61 are connected together, and the collector terminals of the first and third NPN bipolar transistors 62, 61 are connected to the drive potential VG of the semiconductor power component 60 via a diode 75 in the forward direction.

The emitter of the first NPN bipolar transistor 62 is connected to the base of the fourth NPN bipolar transistor 63, and the emitter of the third NPN bipolar transistor 61 is connected to the base of the second NPN bipolar transistor 64.

The fifth MOS transistor 76 and the sixth MOS transistor 78 are connected in series between the reference-ground potential, that is to say that terminal of the sense resistor 55' which is connected to the load output terminal, and that terminal of the semiconductor power component 60 which is connected to the supply potential $V_D$.

In this case, the gate of the fifth MOS transistor 76 is connected to the collector of the third PNP bipolar transistor 66, and the gate of the sixth MOS transistor 78 is connected to the drive potential of the semiconductor power component 60.

Finally, a node between the fifth and sixth MOS transistors 76, 78 is connected to the common base of the first and third NPN transistors 62, 61.

In contrast to the first and second embodiments described above, then, the four NPN bipolar transistors 61, 62, 63 and 64 are no longer connected in series in pairs, rather the respective two current mirrors constructed from PNP bipolar transistors 65, 66, 67 and 68 and also MOS transistors 71, 72, 73 and 74 pick off the collector current of the lower NPN bipolar transistors 63, 64 and feed it back into the upper NPN bipolar transistors 61, 62.

As a result, no collector of an NPN transistor is connected to the source terminal of the MOS power transistor 60 via forward-biased PN junctions.

It will be understood that the present invention is not restricted to the embodiments described above. In particular, further current mirrors with a corresponding current ratio may be inserted into the circuit in order to increase the sensitivity.

I claim:

1. A current limiting circuit for a controlled semiconductor power component having a main current path, a source terminal, and a control terminal, the circuit which comprises:

a sense resistor connected in series with a main current path of a controlled semiconductor power component, said sense resistor having a terminal connected to a source terminal of the semiconductor power component;

a first supply voltage terminal and a second supply voltage terminal;

a first bipolar transistor having a collector, an emitter, a base, and load path, a second bipolar transistor having a collector, a base, and a load path, and a current source connected in series with said load paths between said first supply voltage terminal and said terminal of said sense resistor connected to the source terminal of the semiconductor power component, said first bipolar transistor and said second bipolar transistors being connected such that respective collector currents thereof are proportional to one another;

a third bipolar transistor having an emitter and a load path, and a fourth bipolar transistor having a base, a collector, and a load path connected in series with said load path of said third bipolar transistor between the control terminal and said second supply voltage terminal, said emitter of said third bipolar transistor receiving a current impressed on said emitter proportional to a collector current of said fourth bipolar transistor;

said collector and said base of said first bipolar transistor being connected to said base of said third bipolar transistor;

said base of said second bipolar transistor being coupled to a node between said emitter of said third bipolar transistor and said collector of said fourth bipolar transistor;

said base of said fourth bipolar transistor being coupled to a node between said emitter of said first bipolar transistor and said collector of said second bipolar transistor;

whereby an emitter-to-base voltage of said fourth bipolar transistor contains, as voltage components, a voltage drop across said sense resistor, an emitter-to-base voltage of said second and third bipolar transistors with positive sign, and an emitter-to-base voltage of said first bipolar transistor with negative sign, and further voltage components resulting from differences between emitter-to-base voltages of further bipolar transistors operated with a different emitter current density; and wherein said bipolar transistors are of the same type.

2. The current limiting circuit according to claim 1, wherein at least one of said first, second, third, and fourth bipolar transistors (51'–54'; 61–64) has an emitter area different from an emitter area of at least another one of said bipolar transistors.

3. The current limiting circuit according to claim 1, which further comprises:

a fifth bipolar transistor and a sixth bipolar transistor connected, each in series with an associated current source, between said first reference-ground potential and said second reference-ground potential;

wherein said base of said second bipolar transistor is connected to a node between said emitter of said fifth bipolar transistor and a corresponding current source, and said base of said fifth bipolar transistor is connected to a node between said emitter of said third bipolar transistor and said collector of the fourth bipolar transistor; and wherein said base of said fourth bipolar transistor is connected to a node between said emitter of the sixth bipolar transistor and a corresponding current source, and said base of the sixth bipolar transistor is connected to a node between said emitter of said first bipolar transistor and said collector of said second bipolar transistor.

4. The current limiting circuit according to claim 3, wherein said current sources of said fifth bipolar transistor and said sixth bipolar transistors are formed by respective resistors.

5. The current limiting circuit according to claim 3, wherein said current sources of said fifth bipolar transistor and said sixth bipolar transistors are formed by respective NMOS transistors.

6. The current limiting circuit according to claim 5, wherein a common gate potential of said NMOS transistors is a potential of a common base terminal of said first and third bipolar transistors.

7. A current limiting circuit for a controlled semiconductor power component driven with a drive potential and having a main current path, comprising:

a current sense resistor connected in series with a main current path of a controlled semiconductor power component;

a load output terminal;

a first current mirror including a first PNP bipolar transistor having a collector and having an emitter connected to a drive potential of a semiconductor power component, and a second PNP bipolar transistor having an emitter connected to the drive potential of the semiconductor power component;

a second current mirror including a third PNP bipolar transistor having an emitter connected to the drive potential of the semiconductor power component, and a fourth PNP bipolar transistor having an emitter connected to the drive potential of the semiconductor power component;

a third current mirror including a first MOS transistor having a source connected to reference ground potential, and a second MOS transistor having a drain and a source connected to the reference-ground potential;

a fourth current mirror including a third MOS transistor having a drain and having a source connected to the reference ground potential and a fourth MOS transistor having a collector and a source connected to the reference ground potential;

a first NPN bipolar transistor having a base, a collector, and an emitter connected to said drain of said third MOS transistor;

a second NPN bipolar transistor connected between said collector of said fourth PNP bipolar transistor and a terminal of said sense resistor connected to the semiconductor power component, said second NPN bipolar transistor having a base;

a third NPN bipolar transistor having a base connected to said base of said first NPN bipolar transistor, a collector, and an emitter connected to said drain of said second MOS transistor and to said base of said second NPN bipolar transistor;

a fourth NPN bipolar transistor connected between said collector of the first PNP bipolar transistor and the terminal of said sense resistor connected to said load output terminal, said fourth NPN bipolar transistor having a base connected to of said emitter of said first NPN bipolar transistor;

a diode connecting said collectors of said first and said third NPN bipolar transistors to the drive potential of the semiconductor power component in the forward direction;

a fifth MOS transistor and a sixth MOS transistor connected in series between the reference-ground potential of said fourth current mirror and a terminal of the semiconductor power component connected to a supply potential;

said fifth MOS transistor having a gate connected to said collector of said third PNP bipolar transistor and said sixth MOS transistor having a gate connected to the drive potential of the semiconductor power component; and said base of said first NPN bipolar transistor and said base of said third NPN bipolar transistor being commonly connected to a node between said fifth MOS transistor and said sixth MOS transistors.

8. The current limiting circuit according to claim 7, wherein:

said first and second NPN bipolar transistors are connected to render respective collector currents thereof proportional to one another;

said third NPN bipolar transistor is connected to have a current impressed on said emitter proportional to a collector current of said fourth NPN bipolar transistor;

an emitter-to-base voltage of said fourth NPN bipolar transistor contains, as voltage components, a voltage drop across said sense resistor, an emitter-to-base voltage of said second and third NPN bipolar transistors with positive sign, and an emitter-to-base voltage of said first NPN bipolar transistor with negative sign.

9. The current limiting circuit according to claim 7, wherein at least one of said first, second, third, and fourth bipolar transistors (51'–54'; 61–64) has an emitter area different from an emitter area of at least another one of said bipolar transistors.

10. The current limiting circuit according to claim 7, which further comprises:

a fifth bipolar transistor and a sixth bipolar transistor connected, each in series with an associated current source, between said first reference-ground potential and said second reference-ground potential;

wherein said base of said second bipolar transistor is connected to a node between said emitter of said fifth bipolar transistor and a corresponding current source, and said base of said fifth bipolar transistor is connected to a node between said emitter of said third bipolar transistor and said collector of the fourth bipolar transistor; and wherein said base of said fourth bipolar transistor is connected to a node between said emitter of the sixth bipolar transistor and a corresponding current source, and said base of the sixth bipolar transistor is connected to a node between said emitter of said first bipolar transistor and said collector of said second bipolar transistor.

11. The current limiting circuit according to claim 10, wherein said current sources of said fifth bipolar transistor and said sixth bipolar transistors are formed by respective resistors.

12. The current limiting circuit according to claim 10, wherein said current sources of said fifth bipolar transistor and said sixth bipolar transistors are formed by respective NMOS transistors.

13. The current limiting circuit according to claim 12, wherein a common gate potential of said NMOS transistors is a potential of a common base terminal of said first and third bipolar transistors.

* * * * *